United States Patent [19]

Yamashita

[11] Patent Number: 4,806,803

[45] Date of Patent: Feb. 21, 1989

[54] CURRENT SWITCHING CIRCUIT

[75] Inventor: Kiichi Yamashita, Kanagawa, Japan

[73] Assignee: Hitachi, Ltd., Tokyo, Japan

[21] Appl. No.: 867,552

[22] Filed: May 28, 1986

[30] Foreign Application Priority Data

May 29, 1985 [JP] Japan .................................. 60-114058

[51] Int. Cl.[4] ...................... H03K 17/687; H03K 5/22; H03K 5/00; H03K 5/08

[52] U.S. Cl. .................................... 307/571; 307/355; 307/544; 307/559

[58] Field of Search ............... 307/450, 453, 447, 552, 307/553, 554, 555, 557, 558, 559, 561, 565, 567, 568, 355, 571, 544; 372/38

[56] References Cited

U.S. PATENT DOCUMENTS

| | | | |
|---|---|---|---|
| 4,366,567 | 12/1982 | Fukuzawa et al. ................. | 372/38 |
| 4,505,582 | 3/1985 | Zuleeg et al. ..................... | 372/38 |
| 4,612,671 | 9/1986 | Giles ................................. | 372/38 |
| 4,647,800 | 3/1987 | Mesiner et al. .................... | 372/38 |

FOREIGN PATENT DOCUMENTS

| | | | |
|---|---|---|---|
| 0162479 | 10/1982 | Japan ................................. | 372/38 |
| 0005685 | 1/1984 | Japan ................................. | 372/38 |

OTHER PUBLICATIONS

Katsu et al, "A GaAs Monolithic Frequency Divider Using Source Coupled FET Logic", Electron Device Letters, vol. EDL.3, No. 8, Aug. 1982.

*Primary Examiner*—Stanley D. Miller
*Assistant Examiner*—Trong Quang Phan
*Attorney, Agent, or Firm*—Antonelli, Terry & Wands

[57] ABSTRACT

A current switching circuit enabling current switching at a speed of several gigabits per second (Gbit/sec) or several giga Hertz (GHz) in analog integrated circuits and digital integrated circuits using GaAs FETs is so constructed that the current switching is effected by a pair of diodes, whose cathodes are connected in common and which are driven by a GaAs FET circuit (source follower circuit). This current switching circuit includes first and second FETs, each of which has a source, a drain and a gate. First and second input signals are connected to the gates of the first and the second FETs, respectively. First and second diodes are provided with anodes connected with the sources of the first and the second FETs, respectively. A constant current source is connected in common with the cathodes of the first and the second diodes, and a load circuit is connected with the drain of at least one of the first and the second FETs. By virtue of this arrangement, current flowing through the load circuit is switched, depending on the first and the second input signals, with an output signal being taken out from each load circuit.

10 Claims, 2 Drawing Sheets

CURRENT SWITCHING CIRCUIT

BACKGROUND OF THE INVENTION

This invention relates to a current switching circuit using field effect transistors and a diode pair, which is applied to analog and digital integrated circuits for communication, computer and measuring systems.

Recently, analog integrated circuits and digital integrated circuits, which can process signals at a speed of several gigabits per second (Gbit/sec) or several giga Hertz (GHz), are required more increasingly in connection with the recent upgrading of signal processing time in communication, computer, measuring systems and so forth. As devices realizing integrated circuits operating at Gbit/sec bands, GaAs FETs (Field Effect Transistor) which replace conventional Si transistors, are very promising, and development of analog integrated circuits and digital integrated circuits using these FETs has been being carried out actively.

On the other hand, a current switching circuit consisting of a differentially connected transistor pair is one of basic circuits for realizing analog integrated circuits and digital integrated circuits capable of several gigabits per second (Gbit/sec) or several giga Hertz (GHz) signal processing. This current switching circuit is particularly promising as a circuit for realizing differential amplifiers, logic gates, and so forth. Recently it has been applied to circuits, for which ultra-high speed large current switching is required, such as laser diode driver circuits for optical communication.

However, in order to achieve the increased gain of differential amplifiers or ultra-high speed large current switching of logic gate circuits, laser driving circuit, etc., it is necessary to make the transconductance of the current switching circuit as large as possible. In order to enlarge the transconductance, it is important to reduce the amplitude of the input signal, which is necessary for perfectly switching the current, and this was a significant technical subject to be solved for realizing analog integrated circuits and digital integrated circuits operating at Gbit/sec bands.

For the differential connected transistor pair described above constituting the current switching circuit, in general, bipolar transistors or FETs are used. For example, FIG. 1 shows a circuit diagram of an FET current switching circuit, which has been heretofore widely utilized in differential amplifiers, logic gate circuits, semiconductor laser driving circuits and the like (e.g., see Technical Report of the Institute of Electronics and Communication Engineers of Japan, OQE 83-58, Aug. 25, 1983). The current switching circuit using FET has an advantage in that its production process is simple because of its lateral structure. This circuit switches the current of a constant current source 3 by means of a current switch consisting of source-coupled FET 1 and FET 2, depending on the potential difference between two complementary input signals, which are supplied through terminals 10 and 12, respectively, in order to supply the current to load circuits (resistors or FETs for differential amplifiers or logic gate circuits and lasers for semiconductor laser driving circuits) 4 and 5, and to take out the output (light output for the laser driving circuits) from terminals 21 and 22. However, FETs have a disadvantage that their mutual conductance is smaller by about one order of magnitude than that of bipolr transistors and that large input signal amplitude is necessary for switching the current because they operate based on square rule in their voltage-current characteristic.

In FIG. 1, representing the current flowing through FET 1 by $i_1$, the current of the constant current source 3 by $I_0$, the potential difference between the two input signals at the terminals 10 and 12 by $v_i$, and the conductance factor of the FETs 1 and 2 by K, the switching characteristics can be given by the following equation:

$$\frac{i_1}{I_0} = \tfrac{1}{2}\left(1 + \frac{Kv_i}{I_0}\sqrt{2\frac{I_0}{K} - v_i^2}\right) \tag{1}$$

From Eq. (1) the input signal amplitude necessary for completely switching the current is $$2\sqrt{\frac{I_0}{K}},$$

which means that the larger the current to be switched, the larger is the input signal amplitude necessary for switching the current. For example, suppose that the current to be switched is 20 mA (e.g. in a laser driving circuit) and K is 20 mA/V$^2$. Then, the input signal amplitude necessary for switching the current is 2 V$_{p\text{-}p}$, which is very large.

FIG. 2 indicates a current switching circuit, wherein the pair of differentially connected transistors is constructed by bipolar transistors 101 and 102. This circuit has a large mutual conductance, because the collector current of the transistors 101, 102 varies exponentially with respect to the base-emitter voltage, and it has, therefore, a remarkable feature that an input signal amplitude less than 0.2 V is sufficient for switching the current. However, since the bipolar transistors should be constructed in a vertical NPN structure, in the case where a substrate of GaAs is used, it is very difficult to enlarge the integration scale and to realize ICs with a high production yield.

SUMMARY OF THE INVENTION

An object of this invention is to provide a current switching circuit consisting of FETs and a diode pair having good current switching characteristics.

Another object of this invention is to provide a current switching circuit suitable for increasing the gain of a differential amplifier and for switching a high intensity current with an ultra-high speed in a logic gate circuit or a semiconductor laser driving circuit.

In accordance with one aspect of the present invention, a current switching circuit according to this invention comprises a first and a second FETs (1, 2), each of which has a source, a drain and a gate, a first and a second input signal being given to the gate of said first and said second FETs, respectively; a first and a second diode (51, 52), whose anodes are connected with the sources of said first and said second FETs, respectively; a constant current source (3), with which the cathodes of said first and said second diodes are connected in common; and a load circuit (61) connected with the drain of at least one of said first and said second FETs; whereby current flowing through said load circuit is switched, depending on said first and said second input signal, an output signal being taken out from said load circuit.

According to this invention, since the input signal amplitude necessary for switching the current can be reduced to a value smaller than that of conventional circuits, it is possible to provide a current switching circuit enabling a high speed and high intensity current switching with a small input signal amplitude. Further, owing to this fact, it is possible to realize high speed driving of communication equipment, measurement instruments, information processing devices and so forth working at a speed of several gigabits per second or several giga Hertz.

DESCRIPTION OF THE PREFERRED EMBODIMENT

Figure 1:
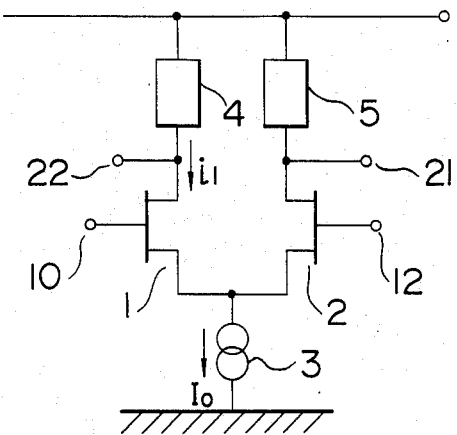
FIGS. 1 and 2 are schematic diagrams illustrating prior art current switching circuits.
Figure 2:
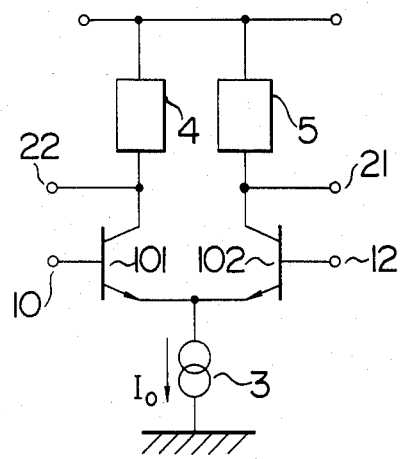
Figure 3:
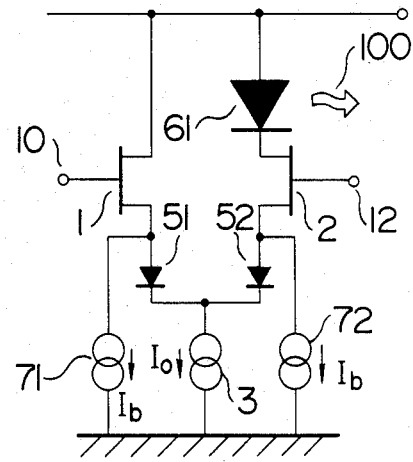
FIG. 3 is a schematic diagram illustrating an embodiment of this invention.

Hereinbelow an embodiment of this invention will be explained, referring to the drawings. FIG. 3 is a schematic diagram illustrating the embodiment of this invention. In this embodiment, as the load circuit 5 in FIG. 1 a semiconductor laser 61 is used. Reference numerals 51 and 52 represent a pair of diodes inserted for current switching, whose cathodes are connected with each other. The cathodes of the pair of the diodes 51 and 52 connected with each other is connected with a constant current source 3 in common. To the sources are connected bias circuits 71 and 72, respectively, for biasing the source follower FETs 1 and 2 (although constant current sources are indicated here, they can be resistors). Now the working mode of the circuit according to this embodiment will be explained. At first, when the potential $v_{i1}$ at the terminal 10 rises and the potential $v_{i2}$ at the terminal 12 falls, the potential of the anode of the diode pair 51 and 52 rises and falls, respectively, together with the potentials $v_{i1}$ and $v_{i2}$. Since the cathodes of the diode pair 51 and 52 are connected in common, the current $i_1$ flowing through the diode 51 increases and the current $i_2$ flowing through the diode 52 decreases. Representing the anode potentials of the diode pair 51 and 52 by $v_1$ and $v_2$, respectively, variations of these currents can be given by the following equations;

$$i_1 = \frac{I_0}{1 + e^{-\beta(v_1-v_2)}} \\ i_2 = \frac{I_0}{1 + e^{\beta(v_1-v_2)}} \quad (2)$$

Since $1/\beta$ is a constant and 25 mV at the room temperature, when $(v_1-v_2)$ is greater than 100 mV, the current $I_0$ of the constant current source 3 is switched. At this time, $I_0$ flows through FET 1 and the signal current through FET 2 becomes zero. Consequently, no current flows through the semiconductor laser 61 and the light output is turned off. To the contrary, when the potential $v_{i1}$ becomes lower than the potential $v_{i2}$ and the potential difference therebetween exceeds 100 mV, $I_0$ flows through FET 2, the semiconductor laser 61 outputs a light signal 100. At this time no signal current flows through FET 1.

As is obvious from the above explanation, an input signal amplitude $(V_1-V_2)$ of about 100 mV is sufficient for switching the current. However, since a gate-source voltage $v_{gs}=v_{i1}-v_1$ is produced between the gate and the source in FETs 1 and 2 constituting the source follower, depending on the signal current, the difference between the potentials applied actually to the diode pair 51 and 52 becomes lower than the potential difference $(V_1-V_2)$ between the input signals. The constant current sources 71 and 72 reduce influence on variations of the voltage between the gate and the source produced by variations of the currents flowing through FETs 1 and 2. That is, representing the bias current of the source follower FETs 1 and 2 by $I_b$, the voltage between the gate and the source by $(v_{i1}-v_1)$ and the threshold voltage by $v_p$, the following equations hold:

$$I_b + i_1 = K(v_{i1} - v_1 - v_p)^2 \\ I_b + i_2 = K(v_{i2} - v_2 - v_p)^2 \quad (3)$$

Figure 4:
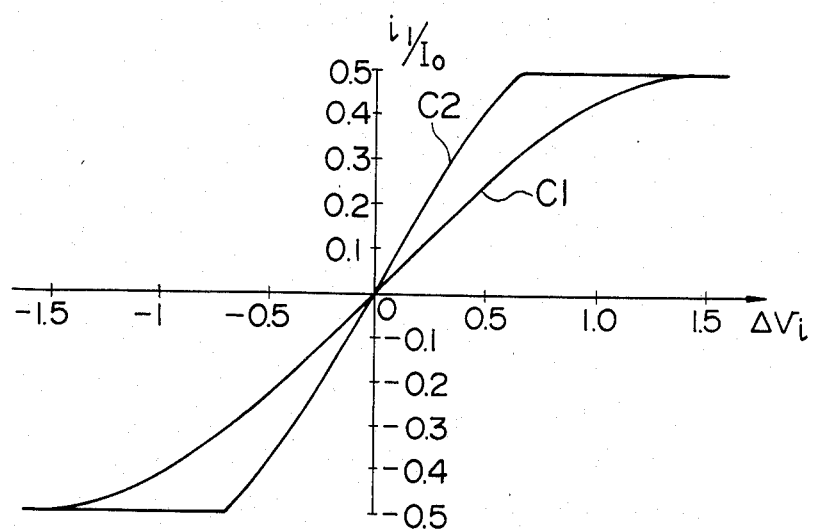
FIG. 4 is a diagram indicating current-input signal amplitude characteristics of a current switching circuit according to this invention with respect to those of a prior art technique.

The dependence of the current on the input signal amplitude can be represented as follows, by using Eqs. (2) and (3):

$$\frac{i_1}{I_0} = \frac{1}{1 + e^{-\beta(\Delta v_i - \Delta v)}} \quad (4)$$

$$\Delta \cdot v = \sqrt{\frac{I_0}{K}} (\sqrt{I_b' + i_1'} - \sqrt{1 + I_b' - i_1'})$$

where $\Delta v_i = v_{i1}-v_{i2}$, $I_b' = I_b/I_0$, $i_1' = i_1/I_0$ and $\Delta v$ represents the term of the negative feedback effect due to source current based on the dependence of the gate-source voltage $(v_{i1}-v_1)$ in the source follower FETs 1 and 2 on the current. FIG. 4 indicates the current-input voltage dependence obtained by using Eqs. (4) and (1). The figure illustrates results of calculations under the condition that $I_0 = 20$ mA, $K = 10$ mA/V$^2$ and $I_b = 10$ mA. For the prior art circuit an input signal amplitude of about 3 V is necessary for switching completely the current, as indicated by the curve C1. On the other hand, according to this invention, an input signal amplitude of 1.3 V is sufficient, as it is obvious from the curve C2, and it is seen that the input signal amplitude is reduced to 1/2.5 of the conventional value.

Figure 5:
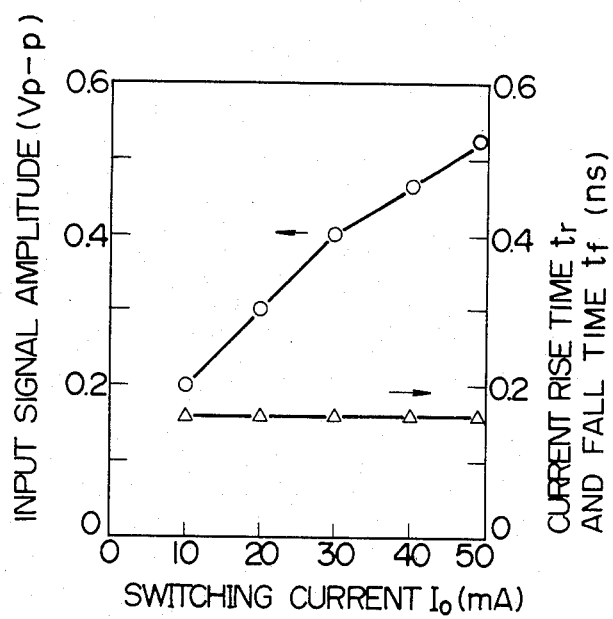
FIG. 5 is a diagram indicating characteristics of a current switching circuit according to this invention.

FIG. 5 indicates results of a simulation of the dependence of the input signal amplitude and the rise time $t_r$ and fall time $t_f$ of the current to be switched on the current $I_0$, where it is supposed that K of FETs 1, 2 is set to 60 mA/V$^2$ and $I_b$ to 25 mA. When the current $I_0$ to be switched increases, the input signal amplitude necessary for the switching increases accordingly, but the increment rate has a tendency to be saturated. For example, when $I_0 = 50$ mA, the input signal amplitude necessary for switching is 0.5 $V_{p-p}$ and an increase of the input signal amplitude for an increase of the current of 20 mA is as small as 0.1 $V_{p-p}$. On the other hand, $t_r$ and $t_f$ do not depend on the intensity of the current to be switched, but it remains almost constant and equal to 0.16 ns. Thus it has been proved that the current switching circuit according to this invention can operate at an ultra-high speed in Gbit/sec bands over a wide range of the current level to be switched.

Further, when this invention is applied to a semiconductor laser driving circuit as indicated in FIG. 3, it is possible to bias-control a laser by controlling the bias current $I_b$ and thus it has an advantage of simplifying the circuit. Further it is obvious that according to this invention, it is possible to construct a differential amplifier and a logic gate circuit by using resistors or FETs as a load circuit. In this way, it is possible to increase their gain and to drive them with a high speed.

I claim:

1. A current switching circuit comprising:
   first and second FETs, each having a source, a drain and a gate, wherein first and second input signals are connected to the gates of said first and second FETs, respectively;
   first and second diodes, whose anodes are connected with the sources of said first and said second FETs, respectively;
   a constant current source, with which the cathodes of said first and said second diodes are connected in common; and
   a load circuit connected with the drain of at least one of said first and second FETs;
   wherein current flowing through said load circuit is switched, depending on said first and said second input signals, and further wherein an output signal for the current switching circuit is taken out from said each load circuit so that the output for said current switching circuit is provided on the drain side of said first and second FETs.

2. A current switching circuit according to claim 1, further comprising first and second bias circuits connected with the sources of said first and said second FETs, respectively.

3. A current switching circuit according to claim 1, said load circuit comprises a semiconductor laser.

4. A current switching circuit according to claim 1, wherein said first and second input signals are complementary to one another.

5. A current switching circuit comprising:
   first and second FETs, each having a source, a drain and a gate, responsive to a first and a second input signal, respectively;
   first and second diodes, whose anodes are connected with the sources of said first and said second FETs, respectively;
   a constant current source, with which the cathodes of said first and said second diodes are connected in common;
   first and second bias circuits controlling bias current, connected with the sources of said first and said second FETs, respectively; and
   a load circuit connected with the drain of at least one of said first and said second FETs;
   wherein current flowing through said load circuit is switched, depending on said first and said second input signals, and further wherein an output signal for the current switching circuit is taken out from said each load circuit so that the output for said current switching circuit is provided on the drain side of said first and second FETs.

6. A current switching circuit according to claim 4, said load circuit comprises a semiconductor laser.

7. A current switching circuit according to claim 5, wherein said first and second input signals are complementary to one another.

8. A current switching circuit comprising:
   first and second FETs, each having a source, a drain and a gate, wherein first and second input signals are connected to the gates of said first and second FETs, respectively;
   first and second diodes, whose anodes are connected with the sources of said first and said second FETs, respectively;
   a constant current source, with which the cathodes of said first and said second diodes are connected in common; and
   a semiconductor laser connected with the drain of at least one of said first and said second FETs;
   wherein current flowing through said laser circuit is switched, depending on said first and said second input signals, and further wherein a light signal for said current switching circuit is taken out from said each laser so that said light signal for said current switching circuit is provided on the drain side of said first and second FETs.

9. A current switching circuit according to claim 8, further comprising first and second bias circuits connected with the sources of said first and said second FETs, respectively.

10. A current switching circuit according to claim 8, wherein said first and second input signals are complementary to one another.

* * * * *